United States Patent
Kretschmann et al.

(10) Patent No.: US 6,664,786 B2
(45) Date of Patent: Dec. 16, 2003

(54) MAGNETIC FIELD SENSOR USING MICROELECTROMECHANICAL SYSTEM

(75) Inventors: Robert J. Kretschmann, Bay Village, OH (US); Richard D. Harris, Solon, OH (US)

(73) Assignee: Rockwell Automation Technologies, Inc., Mayfield Heights, OH (US)

(*) Notice: Subject to any disclaimer, the term of this patent is extended or adjusted under 35 U.S.C. 154(b) by 4 days.

(21) Appl. No.: 09/964,789

(22) Filed: Sep. 27, 2001

(65) Prior Publication Data
US 2003/0020472 A1 Jan. 30, 2003

Related U.S. Application Data
(60) Provisional application No. 60/308,714, filed on Jul. 30, 2001.

(51) Int. Cl.[7] .................................................. G01R 33/02
(52) U.S. Cl. ..................... 324/259; 324/207.14; 324/244
(58) Field of Search ................................. 324/259–260, 324/207.15, 207.14, 244–244.1, 658, 691, 256, 258; 73/514.32, 514.36, 514.16, 514.38, 514.24, 514.18; 280/735

(56) References Cited

U.S. PATENT DOCUMENTS

| | | | |
|---|---|---|---|
| 3,886,447 A | 5/1975 | Tanaka | |
| 4,560,953 A | 12/1985 | Bozio | |
| 5,012,207 A | 4/1991 | Edwards | |
| 5,025,346 A | 6/1991 | Tang et al. | |
| 5,194,819 A | 3/1993 | Briefer | |
| 5,243,861 A | 9/1993 | Kloeck et al. | |
| 5,343,157 A | 8/1994 | Deschamps | |
| 5,359,893 A | 11/1994 | Dunn | |
| 5,413,668 A | 5/1995 | Aslam et al. | |
| 5,417,312 A | 5/1995 | Tsuchitani et al. | |
| 5,424,650 A | 6/1995 | Frick | |
| 5,491,604 A | 2/1996 | Nguyen et al. | |
| 5,536,988 A | 7/1996 | Zhang et al. | |
| 5,563,343 A | * 10/1996 | Shaw et al. ............... | 73/514.18 |
| 5,572,057 A | 11/1996 | Yamamoto et al. | |
| 5,578,976 A | 11/1996 | Yao | |
| 5,585,311 A | 12/1996 | Ko | |
| 5,600,190 A | 2/1997 | Zettler | |

(List continued on next page.)

FOREIGN PATENT DOCUMENTS

| | | |
|---|---|---|
| EP | 0 665 590 A2 | 8/1995 |
| EP | 0 711 029 A2 | 5/1996 |
| EP | 0 763 844 A2 | 3/1997 |

OTHER PUBLICATIONS

Toumazou, C. et al., n–step Charge Injection Cancellation Scheme for Very Accurate Switched Current Circuits, Electronic Letters, v.30 (9) 680–681: 1994.

Emmerich, H., et al., A Novel Micromachined Magnetic–Field Sensor, MEMS 99 IEEE Conference, Jan. 17–21, 1999, IEEE Catalog No. 99ch36291c.

(List continued on next page.)

Primary Examiner—Jay Patidar
Assistant Examiner—Subhash Zaveri
(74) Attorney, Agent, or Firm—Quarles & Brady; Alexander M. Gerasimow; William R. Walbrun

(57) ABSTRACT

A microelectromechanical systems (MEMS) Device manufactured on a microscopic scale using integrated circuit techniques provides a sensitive magnetic field sensor by detecting motion caused by the Lorentz force produced by a current through a MEMS conductor. The resulting MEMS may be used as a component in a variety of devices including current sensors and proximity sensors.

50 Claims, 6 Drawing Sheets

U.S. PATENT DOCUMENTS

| | | | |
|---|---|---|---|
| 5,646,432 A | | 7/1997 | Iwaki et al. |
| 5,658,698 A | | 8/1997 | Yagi et al. |
| 5,761,350 A | | 6/1998 | Koh |
| 5,783,340 A | | 7/1998 | Farino et al. |
| 5,798,283 A | | 8/1998 | Montague et al. |
| 5,804,314 A | | 9/1998 | Field et al. |
| 5,815,051 A | | 9/1998 | Hamasaki et al. |
| 5,834,864 A | | 11/1998 | Hesterman et al. |
| 5,877,038 A | | 3/1999 | Coldren et al. |
| 5,903,380 A | | 5/1999 | Motamedi et al. |
| 5,920,978 A | | 7/1999 | Koshikawa et al. |
| 5,943,155 A | | 8/1999 | Goossen |
| 5,955,932 A | | 9/1999 | Nguyen et al. |
| 5,959,516 A | | 9/1999 | Chang et al. |
| 5,995,688 A | | 11/1999 | Aksyuk et al. |
| 6,035,714 A | * | 3/2000 | Yazdi et al. ............. 73/514.32 |
| 6,046,066 A | | 4/2000 | Fang et al. |
| 6,060,336 A | | 5/2000 | Wan |
| 6,071,426 A | | 6/2000 | Lee et al. |
| 6,094,102 A | | 7/2000 | Chang et al. |
| 6,100,477 A | | 8/2000 | Randall et al. |
| 6,114,794 A | | 9/2000 | Dhuler et al. |
| 6,116,756 A | | 9/2000 | Peeters et al. |
| 6,127,767 A | | 10/2000 | Lee et al. |
| 6,137,206 A | | 10/2000 | Hill |
| 6,144,545 A | | 11/2000 | Lee et al. |
| 6,149,190 A | * | 11/2000 | Galvin et al. ............... 282/735 |
| 6,159,385 A | | 12/2000 | Yao et al. |
| 6,170,332 B1 | | 1/2001 | MacDonald et al. |
| 6,188,322 B1 | | 2/2001 | Yao et al. |
| 6,232,150 B1 | | 5/2001 | Lin et al. |
| 6,232,841 B1 | | 5/2001 | Bartlett et al. |
| 6,232,847 B1 | | 5/2001 | Marcy, 5th et al. |
| 6,236,281 B1 | | 5/2001 | Nguyen et al. |
| 6,257,705 B1 | | 7/2001 | Silverbrook |
| 6,265,238 B1 | | 7/2001 | Yaji et al. |
| 6,307,169 B1 | | 10/2001 | Sun et al. |
| 6,316,278 B1 | | 11/2001 | Jacobsen et al. |
| 6,348,788 B1 | | 2/2002 | Yao et al. |
| 6,356,378 B1 | | 3/2002 | Huibers |
| 6,356,689 B1 | | 3/2002 | Greywall |
| 6,373,682 B1 | | 4/2002 | Goodwin-Johansson |
| 6,384,353 B1 | | 5/2002 | Huang et al. |
| 6,391,742 B2 | | 5/2002 | Kawai |
| 6,400,009 B1 | | 6/2002 | Bishop et al. |
| 6,411,214 B1 | | 6/2002 | Yao et al. |
| 6,417,743 B1 | | 7/2002 | Mihailovich et al. |
| 6,463,339 B1 | | 10/2002 | Vasko |
| 6,465,929 B1 | | 10/2002 | Levitan et al. |
| 6,466,005 B1 | | 10/2002 | Yao et al. |
| 6,497,141 B1 | | 12/2002 | Turner et al. |
| 6,504,356 B2 | | 1/2003 | Yao et al. |
| 2002/0017132 A1 | | 2/2002 | McNie et al. |

OTHER PUBLICATIONS

Madou, Marc, Fundamentals of Microfabrication, Chapters 2–4, CRC Press LLC, Boca Raton, FL: 1997.

Kovacs, Gregory T.A., Micormachined Transducers Sourcebook, Table of Contents, pp. 77–119 and Index, WCB McGraw–Hill, U.S.A.: 1998.

Teegarden, Darrell et al., How to Model and Simulate Microgyroscope Systems, IEEE Spectrum, 66–75, Jul. 1998.

Emmerich, Harald et al., Magnetic Field Measurements with a Novel Surface Micromachined Magnetic–Field Sensor, IEEE Transactions on Electron Devices, v. 47 (5) 972–977, May 2000.

McGruer, N.E. et al., Electrostatically Actuated Microswitches; Scaling Properties, Solid–State Sensor and Actuator Workshop, Hilton Head Island, South Carolina, Jun. 8–11, 1998, pp. 132–135.

Miyajima, Hiroshi et al., High–Aspect–Ratio Photolithography for MEMS Applications, J. of Microelectromechanical Sys., v.4(4) 220–229, Dec. 1995.

Lu, Crist et al., A Monolithic Surface Micromachined Accelerometer with Digital Output, IEEE J. of Solid State Circuits, v. 30 (12) 1367–1373, Dec. 1995.

Chen, Ming–Jer et al., Weak Inversion Charge Injection in Analog MOS Switches, IEEE J. of Solid–State Circuits, v. 30 (5) 604–606, May 1995.

Lemkin, Mark. A. et al., A Fully Differential Lateral S? Accelerometer with Drift Cancellation Circuitry, Solid–State Sensor and Actuator Workshop, Hilton Head, South Carolina, Jun. 2–6, 1996, pp. 90–93.

Boser, Bernhard E. et al., Surface Micromachined Accelerometers, IEEE J. of Solid–State Circuits, v. 31 (3) 366–375, Mar. 1996.

Fedder, Gary K. et al., Multimode Digital Control of a Suspended Polysilicon Microstructure, J. of Microelectromechanical Sys., V. 5 (4) 283–297, Dec. 1996.

Noriega, Gerardo, Sigma–Delta A/D Converters–Audio and Medium Bandwidths, Technical Notes–DT3 from RMS Instruments website: www.rmsinst.com, 6 pages, Feb. 1996.

Internet page: Decimator Filter DLL, NeuroDimension Inc.: www.nd.com , May 31, 2001.

U.S. patent application Ser. No.: 09/406,654, filed on Sep. 27, 1999.

U.S. patent application Ser. No.: 09/400,125, filed on Sep. 21, 1999.

U.S. patent application Ser. No.: 09/406,509, filed on Sep. 28, 1999.

U.S. patent application Ser. No.: 09/955,493, filed on Sep. 18, 2001.

U.S. patent application Ser. No.: 09/955,494, filed on Sep. 18, 2001.

U.S. patent application Ser. No.: 09/675,861, filed on Sep. 29, 2000.

Storment, C.W., et al. "Flexible, Dry–Released Process for Aluminum Electrostatic Actuators." Journal of Microelectromechanical Systems, 3(3), Sep. 1994, pp. 90–96.

* cited by examiner

MAGNETIC FIELD SENSOR USING MICROELECTROMECHANICAL SYSTEM

CROSS-REFERENCE TO RELATED APPLICATIONS

This case claims the benefit of provisional application Serial No. 60/308,714 filed Jul. 30, 2001.

STATEMENT REGARDING FEDERALLY SPONSORED RESEARCH OR DEVELOPMENT

BACKGROUND OF THE INVENTION

The present invention relates to sensors for detecting the presence and/or strength of a magnetic field and, in particular, to a microelectromechanical system (MEMS) device providing for such measurements.

A magnetic field can be detected by noting its influence on a magnetic material or a current carrying wire. The former technique is used in a compass; the latter technique describes the common D'Arsonval movement used in electrical meters.

A Hall effect sensor may be used in applications that require a more compact and rugged sensor. Hall effect sensors detect the drift of charge carriers in a semiconductor material in the presence of a magnetic field. This drift causes a transverse polarization of that semiconductor which can be detected as a voltage.

Hall effect sensors are currently used in a number of applications including, switches, proximity sensors and magnetometers.

SUMMARY OF THE INVENTION

The present invention provides an alternative to the Hall effect sensor that is both rugged and small and promises improved sensitivity over, and more flexible implementation than the Hall effect sensor. In this regard, the invention provides a sensor constructed using a microelectromechanical system (MEMS) device, which may be mass-produced using integrated circuit techniques.

In the invention, a microscopic conductor extends between two terminals on a substrate and conducts a proof current. Deflection of the current carrying conductor under the influence of a magnetic field, caused by the Lorentz force, is measured by a detector coupled to the conductor to produce an output dependent on that deflection. The small size and mass of the flexible conductor make kilohertz or higher response speeds possible.

Generally, the output signal may be analog or digital depending on the selection of the detector and its processing circuitry. Optionally, the invention may include circuit elements providing the proof current on-board or the proof current may be supplied externally using a conventional current source. The flexible conductor may be a straight conductive segment for simple fabrication.

In one embodiment, a beam connects the flexible conductor to the detector and the beam and the flexible conductor may include a metalization layer on an insulating or semiconducting material. The metalization layer may be interrupted on the beam to provide electrical isolation between the detector and flexible conductor.

The detector may include a bias means producing a force resisting the Lorentz force on the flexible conductor. The bias means may be a mechanical element such as a MEMS spring or may be an electrical element such as an electrostatic, piezoelectric or thermal motor. The bias means may be either passive or active. If an electrical element is used, the invention may include a feedback circuit communicating with the bias means and responding to the output signal to vary a bias force resisting the Lorentz force on the flexible conductor. In this way, the bias means may receive feedback to provide improved linearity in the detection of magnetic fields.

In an alternative embodiment, the invention may include a compensation coil. A feedback circuit responding to the output signal may energize the compensation coil to oppose the crossing magnetic field. This approach provides the benefits of feedback without the need for an electrically actuable bias means, but with the need for a coil structure.

The invention may include a second flexible conductor and detector also producing an output signal and a combiner circuit combining the output signal from the first and second flexible conductors to reject detector signals not related to the strength of the crossing magnetic field B. The flexible conductors may be arranged to have countervailing current flows or may be oriented (in connection to their beams) in opposite directions so that the effect of environmental noise such as mechanical shock or vibration may be distinguished from the Lorentz forces.

The invention may further include a measurement conductor conducting a current to be measured and positioned adjacent to the flexible conductor so that the crossing magnetic field B is a magnetic field produced by the current through the measurement conductor. In this way, the present invention may be used to measure currents. A magnetic core may be used to concentrate the flux from the measurement conductor on the flexible conductor.

Alternatively, the invention may include a magnet providing the crossing magnetic field B and, in this way, may be employed as a proximity detector detecting distortions of the magnetic field caused by nearby ferromagnetic materials. The invention finds potential application in all applications currently served by Hall effect devices.

The foregoing features may not apply to all embodiments of the inventions and are not intended to define the scope of the invention, for which purpose claims are provided. In the following description, reference is made to the accompanying drawings, which form a part hereof, and in which there is shown by way of illustration, a preferred embodiment of the invention. Such embodiment also does not define the scope of the invention and reference must be made therefore to the claims for this purpose.

DETAILED DESCRIPTION OF THE PREFERRED EMBODIMENT

Non-Feedback System

Figure 1:
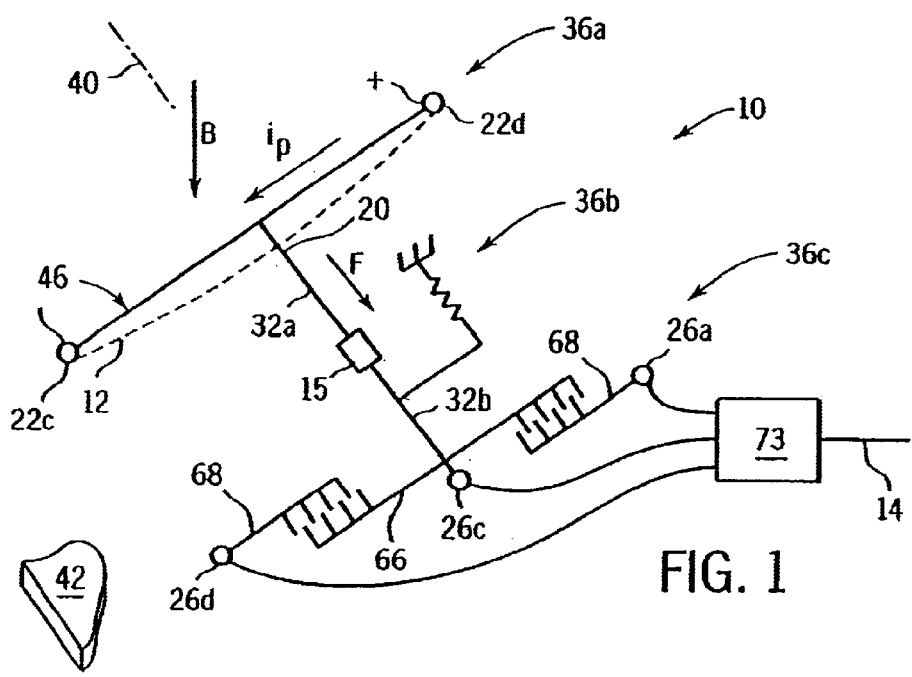
FIG. 1 is a perspective, schematic representation of one embodiment of the magnetic sensor of the present invention showing orientation of the magnetic flux, the proof current and the resulting Lorentz force on a flexible conductor whose deflection is measured by a capacitive sensor.
Figure 2:
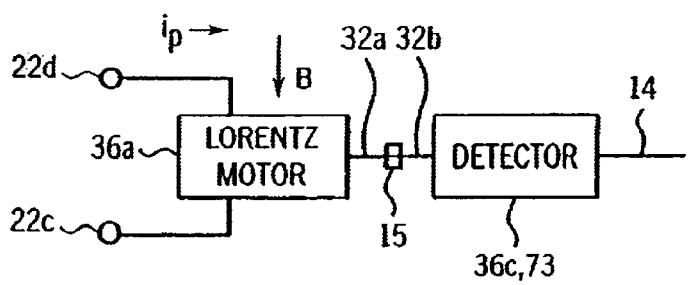
FIG. 2 is a block diagram of the embodiment of FIG. 1 using a flexible conductor coupled directly to a sensor.

Referring now to FIGS. 1 and 2, a microelectromechanical system (MEMS) magnetic field sensor 10 of the present invention provides a first terminal 22c and a second terminal 22d formed on a substrate such as of an integrated circuit but electrically insulated therefrom so that an electrical voltage may be established across the terminals 22c and 22d. In this regard, the substrate may be an insulator or have an insulating top layer so that conductive layers or wire bonding attached to these terminals are all mutually isolated. The substrate may provide for the support and fabrication of other integrated circuitry.

Terminals 22c and 22d are connected by a flexible conductor 46, typically also formed on the substrate material, but separated from the substrate by undercutting so as to provide an unsupported span between terminals 22d and 22c free to flex generally along a longitudinal axis parallel to the plane of the integrated circuit substrate to form a bow 12 indicated by a dotted line. The flexible conductor 46 is positionable within a crossing magnetic field B generally perpendicular to the substrate plane so that a proof current $i_p$ passing from terminal 22d to 22c moves it to the bow 12 in response to Lorentz force F. The flexible conductor thus provides a Lorentz motor actuator device 36a.

A beam 20 is attached to the center of the flexible conductor 46 and may include an insulating section 15 separating a first beam section 32a from a continuation beam section 32b. The beam section 32b may optionally be attached to a bias device 36b providing an additional restoring force tending to restore the flexible conductor 46 from the bow 12 to a straight configuration that compliments the naturally occurring restoring force of the flexible conductor itself. The bias device 36b, if used, may be either a physical or electrical device as will be described below. In addition, bias device 36b, if used, may be either passive or active.

Beam section 32b also supports moving capacitor plates 66 extending laterally from the beam section 32b along the plane of the substrate and having longitudinally extending fingers in a forward and backward direction interdigitating with opposed fingers of corresponding stationary capacitor plates 68 on opposite sides of the beam 20. Two pairs of opposed capacitor plates 66, 68 are thus formed, one of which moves closer together and one of which moves farther apart with motion of the beam 20. The capacitor plates 66, 68 provide a detector device 36c.

The detector device 36c may further include a capacitive sensing circuit 73 such as is described in U.S. patent application Ser. No. 09/677,037, incorporated by reference, attached to a terminal 26c being common with moving capacitor plates 66 and also be attached to terminal 26a and 26d communicating with the two moving capacitor plates 66, respectively. The capacitive sensing circuitry 73 may, but need not be implemented as integrated circuitry on or supported by the same substrate 42 as the (MEMS) magnetic field sensor 10. Measurement of the change in capacitance detects longitudinal movement of the beam 20 and forms the basis of detector output 14 indicating movement of the beam section 32b and hence beam 20 and hence flexible conductor 46.

For a fixed proof current $i_p$ and a restoring force from the stiffness of the flexible conductor observing Hook's law, movement of the beam section 32b will be proportional to the strength of the crossing magnetic field B and thus the detector output 14 will provide a measurement of the strength of the crossing magnetic field B. Control of the proof current $i_p$ will affect the relationship between the force F and the crossing magnetic field B thus allowing change in the sensitivity of the device. The detector output 14 may be an analog output or may be digitized according to methods well known in the art.

Figure 11:
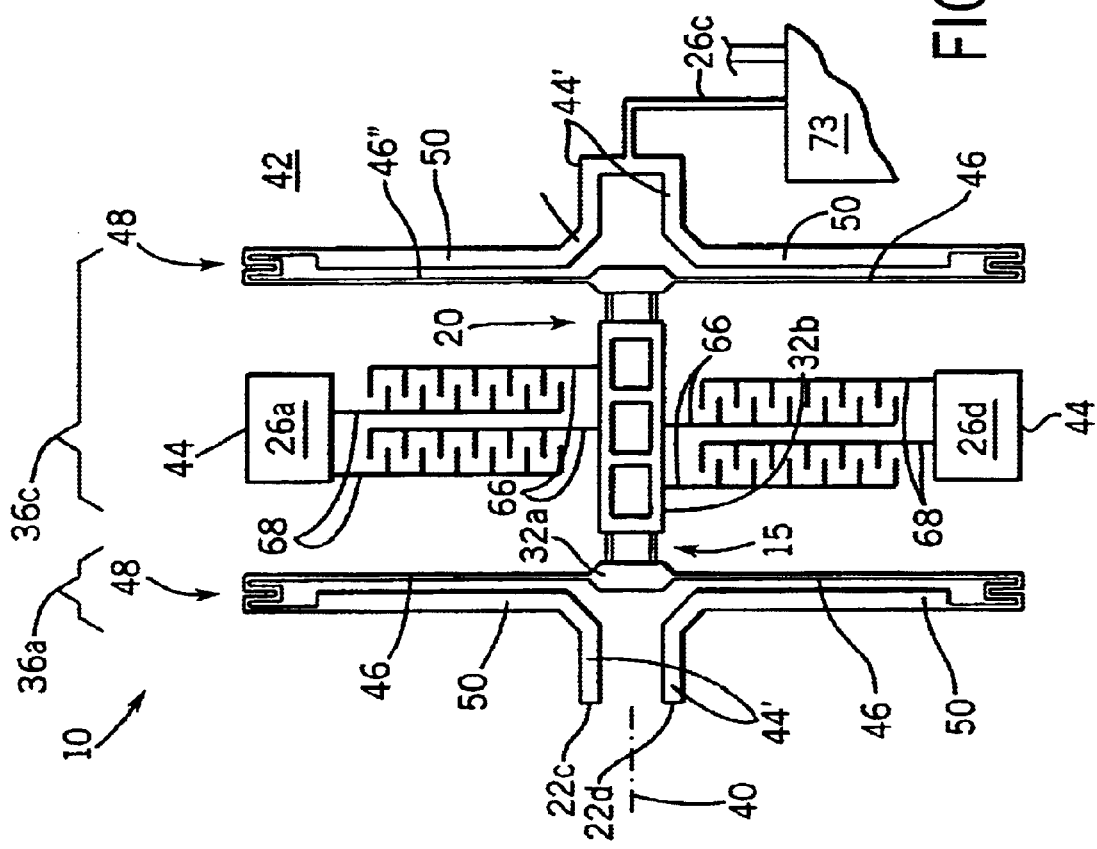
FIG. 11 is a top plan view of the embodiment of FIG. 2 using one flexible conductor for responding to Lorentz forces and a capacitive sensor element.

Specifically, referring now to FIG. 11, the beam 20 may extend above a substrate 42 along the longitudinal axis 40 between longitudinally opposed pylons 44'. The beam 20 may thereby define a midline dividing transversely opposed pylons 44, the latter attached and extending upward from a substrate 42. The leftmost pylons 44' form the terminals 22d and 22c described above while the right most pylons 44' form terminals 26c. The transversely opposed pair of pylons 44, provide terminals 26a and 26d described above.

The beam 20 is supported away from the substrate 42 and held for movement along the longitudinal axis 40 by means of flexible conductors 46 and 46" extending transversely on opposite sides of both ends of the beam 20 and its middle. The flexible conductors 46 and 46" extend transversely away from the beam 20 to elbows 48 removed from the beam 20 on each side of the beam 20. The elbows 48 in turn connect to expansion compensators 50, which return to be attached to the substrate 42 at a point near the beam 20. The support structure and operation of the elbows is described in U.S. patent application Ser. No. 09/805,410 filed Mar. 13, 2001 and hereby incorporated by reference.

The flexible conductors 46 and 46" are connected to expansion compensators 50 which in turn provide electrical connections between each of the beam sections 32a and 32b and stationary electrical terminals. Specifically, the expansion compensators 50, connected to either end of the leftmost flexible conductor 46, connect to terminals 22c and 22d respectively. The expansion compensators 50 attached to rightmost flexible conductor 46" connect to terminal 26c of beam section 32b.

The portion 32a of the beam 20, such as forms part of the Lorentz motor actuator device 36a, is isolated by insulating section 15 from the beam portion 32b and thus a voltage imposed across terminals 22c and 22d provides a current through the flexible conductor 46.

The beam segment 32b may have transversely outwardly extending, moving capacitor plates 66 overlapping with corresponding transversely inwardly extending stationary capacitor plates 68 attached to the pylons 44' supporting terminals 26a and 26d. The capacitor plates serve as a sensing means in which variation in the capacitance between the moving capacitor plates 66 and stationary capacitor plates 68 serves to indicate the position of the beam 20. Each of the moving capacitor plates 66 and their corresponding stationary capacitor plates 68 may have mutually engaging fingers (as opposed to being simple parallel plate capacitors) so as to provide for a more uniform capacitance variation over a greater range of longitudinal travel of the beam 20. In this regard, the order of the stationary and moving capacitor plates 66 and 68 is reversed on opposite sides of the beam 20. Thus, the moving capacitor plates 66 are to the right of the stationary capacitor plates 68 on a first side of the beam (the upper side as depicted in FIG. 11) whereas the reverse order occurs on the lower side of the beam 20. Accordingly as the beam 20 moves to the right, the capacitance formed by the upper moving capacitor plates 66 and stationary capacitor plates 68 decreases while the capacitance formed by the lower plates increases. The point where the value of the upper capacitance crosses the value of the lower capacitance precisely defines a null point and is preferably set midway in the travel of the beam 20. The moving capacitor plates 66 are connected to beam portion 32b and thus connected to terminals 26c. The stationary capacitor plates 68 are connected to terminals 26a and 26d respectively. Capacitor plates 66 and 68 are cantilevered over the substrate 42 by the same under etching used to free the beam 20 from the substrate 42.

Techniques for comparing capacitance well known in the art may be used to evaluate the position of the beam 20. One circuit for providing extremely accurate measurements of these capacitances is described in co-pending application Ser. No. 09/677,037 filed Sep. 29, 2000 and hereby incorporated by reference.

Generally, the operating structure of the MEMS magnetic field sensor 10 is constructed to be symmetric about an axis through the middle of the beam 20 along the longitudinal axis 40 such as to better compensate the thermal expansions. In addition, the operating area of the plates of the capacitors, plates 66 and 68 on both sides of the beam 20 for the sense device 36c are made equal so as to be balanced. For similar reasons, beam 20 is attached to the center of the flexible conductor 46.

The embodiment depicted in FIGS. 1, 2, and 11 is suitable for providing a binary output such as may be suitable for a switch or the like or an analog output. However, the later analog output may be affected by nonlinearities in the Lorentz Force motor 36a or detector device 36c or other source, particularly for larger displacements. These nonlinearities may be reduced by implementing a feedback system.

Feedback System

Figure 3:
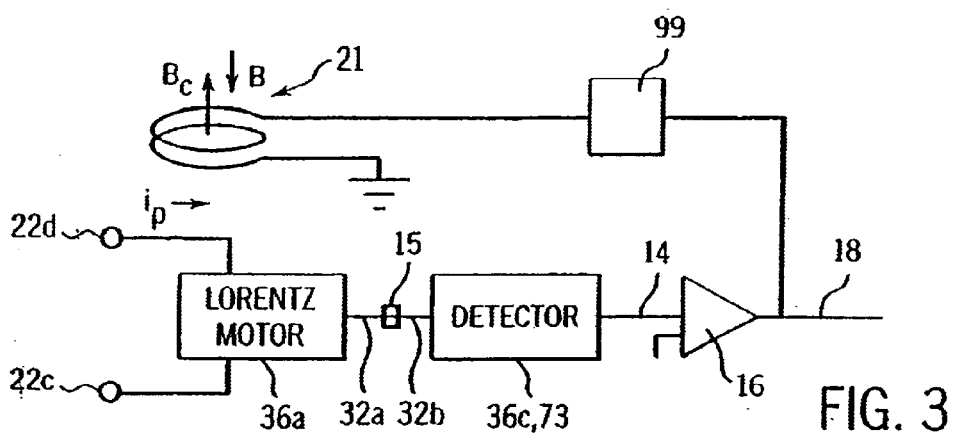
FIG. 3 is a figure similar to that of FIG. 2 showing the addition of a feedback circuit and a compensation coil to provide improved linearity to the device of FIG. 1.

Referring now to FIG. 3, in a feedback system, the detector output 14 is provided to a comparison circuit 16, which provides a output signal 18. The output signal 18 may serve as a new output and is also provided through feedback block 99 to a compensation coil 21 arranged to produce a countervailing magnetic flux $B_c$ oriented to nullify the crossing magnetic field B at the flexible conductor 46. The feedback operates to return the flexible conductor 46 to its relaxed state thus eliminating the nonlinear effects incident to bowing of the flexible conductor 46 and gross movements of the beam 20.

Figure 4:
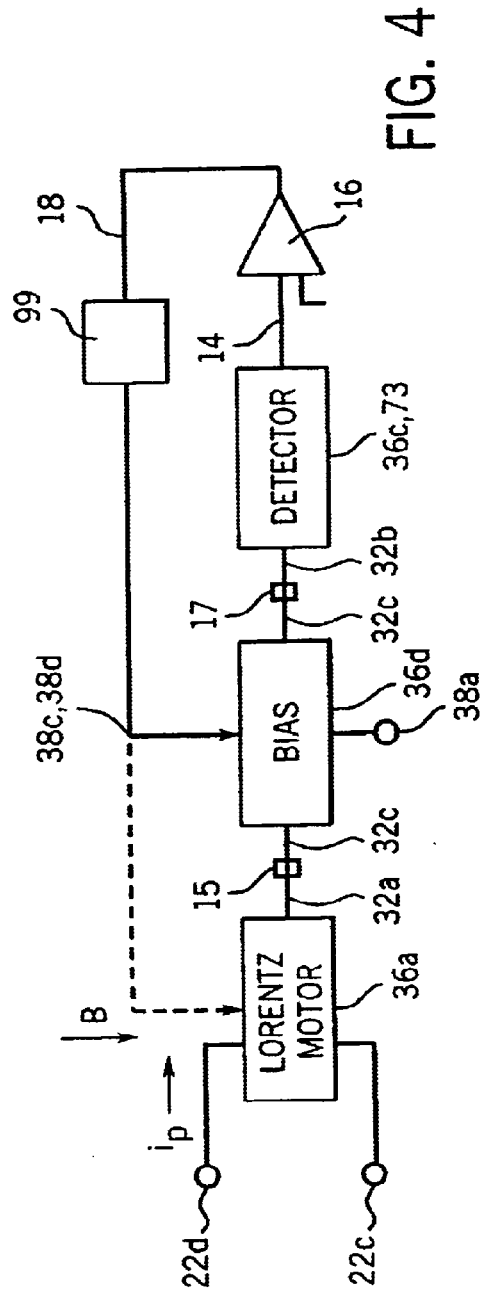
FIG. 4 is a figure similar to that of FIG. 2 showing the addition of an electronically controllable bias device such as may be used for feedback without the need for an external compensation coil.

Referring now to FIG. 4, the need for a compensation coil 21 may be eliminated by the addition of an electrically controlled bias device 36b interposed between the Lorentz motor actuator device 36a and the detector device 36c. Specifically, Lorentz motor actuator device 36a may connect via beam segment 32a through insulating section 15 to beam segment 32c connected to the bias device 36b. Beam section 32c may then connect through insulating section 17 to beam segment 32b, which connects to the detector device 36c as has been described. The bias device 36b may be an electrostatic motor as will be described below, although other bias devices may also be used.

Figure 6:
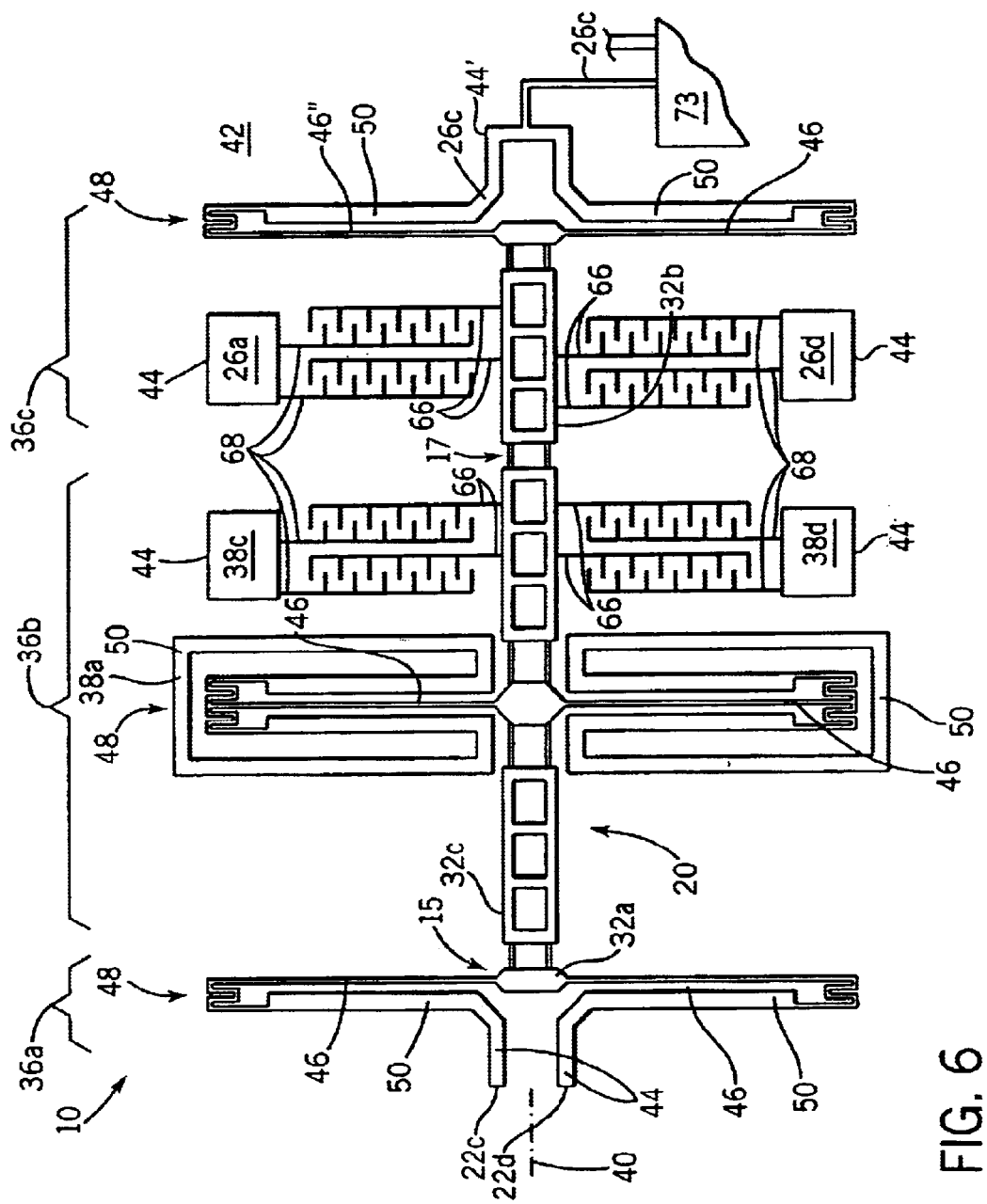
FIG. 6 is a top plan view of the embodiment of FIG. 4 using one flexible conductor for responding to Lorentz forces, an electrostatic motor as the bias device, and a capacitive sensor element.

Specifically, referring now to FIG. 6, the beam 20 may extend above a substrate 42 along the longitudinal axis 40 between longitudinally opposed pylons 44'. The beam 20 may thereby define a midline dividing transversely opposed pylons 44', the latter attached and extending upward from a substrate 42. The leftmost pylons 44' form the terminals 22d and 22c described above while the right most pylons 44' form terminals 26c. One transversely opposed pair of pylons 44, positioned to the right side of the beam 20, provide terminals 26a and 26d described above while a second transversely opposed pair of pylons 44 roughly centered on the beam 20 provide terminals 38c and 38d being part of the electrically controlled bias device 36b.

The beam 20 is supported away from the substrate 42 and held for movement along the longitudinal axis 40 by means of flexible conductors 46 and 46" extending transversely on opposite sides of both ends of the beam 20 and its middle. The flexible conductors 46 and 46" extend transversely away from the beam 20 to elbows 48 removed from the beam 20 on each side of the beam 20. The elbows 48 in turn connect to expansion compensators 50, which return to be attached to the substrate 42 at a point near the beam 20. The support structure and operation of the elbows is described in U.S. patent application Ser. No. 09/805,410 referred to above.

The flexible conductors 46, 46' and 46" are connected to expansion compensators 50 which in turn provide electrical connections between each of the beam sections 32a, 32b and 32c and stationary electrical terminals. Specifically, the expansion compensators 50 connected to either end of the leftmost flexible conductor 46 connect to terminals 22c and 22d respectively. The expansion compensators 50 connected to the middle flexible conductor 46' provide an electrical connection between beam section 32c and terminal 38a. The expansion compensators 50 attached to rightmost flexible conductor 46" connect to terminal 26c to beam section 32b.

The portion 32a of the beam 20, such as forms part of the Lorentz motor actuator device 36a, is isolated by insulating section 15 from the beam portion 32c and thus a voltage imposed across terminals 22c and 22d provides a current through the flexible conductor 46.

The beam segment 32c may have transversely outwardly extending, moving capacitor plates 66 overlapping with corresponding transversely inwardly extending stationary capacitor plates 68 attached to the pylons 44 supporting terminals 38c and 38d. Stationary capacitor plates 68 are leftward of moving capacitor plates 66 on both sides of the beam 20. Each of the moving capacitor plates 66 and their corresponding stationary capacitor plates 68 may have mutually engaging fingers (as opposed to being simple parallel plate capacitors) so as to provide for a more uniform electrostatic force over a greater range of longitudinal travel of the beam 20. An electrostatic motor is thus formed using the attraction between the stationary capacitor plates 68 charged via terminals 38c and 38d and moving capacitor plate 66 charged via terminal 38a to urge the beam 20 leftward. It will be understood from this description that if rightward movement of beam 20 is desired then the left/right order of 68/66 plates can be reversed Capacitor plates 66 and 68 are cantilevered over the substrate 42 by the same under etching used to free the beam 20 from the substrate 42.

Referring still to FIG. 6, portion 32b of the beam 20, isolated from beam portion 32c by insulating section 17 also supports moving capacitor plates 66 and stationary capacitor plates 68. However as mentioned above, in this case, the capacitor plates do not serve the purpose of making an electrostatic motor but instead serve as a sensing means in which variation in the capacitance between the moving capacitor plates 66 and stationary capacitor plates 68 serves to indicate the position of the beam 20. In this regard, the order of the stationary and moving capacitor plates 66 and 68 is reversed on opposite sides of the beam 20. Thus, the moving capacitor plates 66 are to the right of the stationary capacitor plates 68 on a first side of the beam (the upper side as depicted in FIG. 6) whereas the reverse order occurs on the lower side of the beam 20. Accordingly as the beam 20 moves to the right, the capacitance formed by the upper moving capacitor plates 66 and stationary capacitor plates 68 decreases while the capacitance formed by the lower plates increases. The point where the value of the upper capacitance crosses the value of the lower capacitance precisely defines a null point and is preferably set midway in the travel of the beam 20. The moving capacitor plates 66 are connected to beam portion 32b and thus connected to terminals 26c. The stationary capacitor plates 68 are connected to terminals 26a and 26d respectively.

Techniques for comparing capacitance well known in the art may be used to evaluate the position of the beam 20. One circuit for providing extremely accurate measurements of these capacitances is described in co-pending application Ser. No. 09/677,037 filed Sep. 29, 2000 and hereby incorporated by reference.

Generally, the operating structure of the MEMS magnetic field sensor 10 is constructed to be symmetric about an axis through the middle of the beam 20 along the longitudinal axis 40 such as to better compensate the thermal expansions. In addition, the operating area of the plates of the capacitors, plates 66 and 68 on both sides of the beam 20 for the bias device 36b are made equal so as to be balanced. For similar reasons, beam 20 is attached to the center of the flexible conductor 46.

Referring again to FIG. 4, the detector output 14 of the detector device 36c and capacitive sensing circuit 73 may again be received by a comparison circuit 16 to produce output signal 18. This output signal 18 is then passed through feedback block 99 and connected to terminals 38c and 38d and 38a so that rightward movement of the beam 20 produces a greater attraction between stationary plates 68 and moving capacitor plates 66 creating an opposite leftward force on the beam. This feedback provides a linearizing of the response of the MEMS magnetic field sensor 10 according to principles well known in the art.

The electrically controllable bias device 36b may also be used to create a spring-like effect (although one not observing Hooke's law) by imposing a constant voltage across terminals 38c and 38d and terminal 38a. Thus it can be used to compliment the naturally occurring restoring spring force of the flexible conductor itself of the configuration of FIGS. 1, 2, and 11.

In yet another embodiment, the feedback current may be directed directly to a Lorentz motor to counteract or control the proof current $i_p$ going therethrough so long as a residual biasing field $B_b$ (not shown) is provided. $B_b$ is oriented to augment the incident magnetic field to be measured.

Referring for example, to FIG. 11, a simple feedback system can be implemented in this way by controlling the proofing current $i_p$ as a function of displacement of the beam 20 detected by the detector device 36c. The capacitive sensing circuit 73 is used to provide a feedback signal holding the beam at it's neutral position against some mechanical biasing force. For example, with a 20 mA proof current and a residual magnetic field $B_b$, the feedback is some predetermined value holding the beam 20 at the neutral position. As a magnetic field is applied the beam 20 displaces from neutral causing a negative feedback. This negative feedback subtracts from the proof current ip so as to bring the beam 20 back to neutral. The open loop gain in the system establishes the neutral beam error position and the feedback is a measure of the impinging field. No extra beam or coil is needed to affect the feedback. Generally $(B+B_b) \cdot i_p$=Output.

Figure 7:
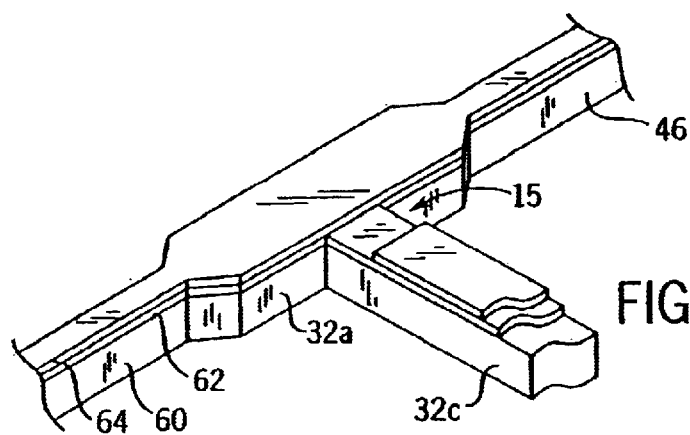
FIG. 7 is a perspective fragmentary view of FIG. 11 showing an insulating segment connecting the flexible conductor to the beam leading to the bias device as is produced by a break in the metalization layer.

Referring now to FIG. 7, flexible conductor 46 may be constructed using integrated circuit techniques in three layers, a lower semiconductor layer 60 such as silicon topped by an insulator 62, for example, silicon dioxide, in turn, topped by metalization layer 64 such as aluminum.

The same structure may be carried onto beam section 32b of FIG. 11 and the insulating section 15 between beam sections 32a and 32b may be created by etching away the metalization layer 64 alone. A similar approach may be used for the insulating section 17 between beam portions 32c and 32b of FIG. 9.

Figure 13:
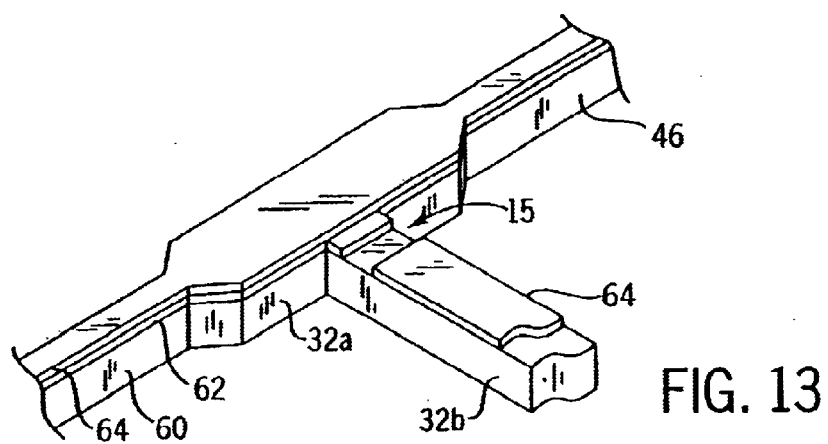
FIG. 13 is a perspective fragmentary view of FIG. 11 showing an insulating layer separating the flexible conductor from a conductive beam in one portion of the beam and a metalization layer in direct contact with the beam in a second portion of the beam forming the detection device.

Referring now to FIG. 11, in an alternative embodiment, the insulating section 15 between the detector device 36c and the Lorentz motor 36a uses a different technique which incurs direct metal to silicon contact within 36c to take advantage of the total height of the silicone structure in creating opposed capacitor plates. Accordingly, referring to FIG. 13, the structure is much the same as described above as depicted in FIG. 7, with the exception that the insulating layer 62 is removed from the regions of beam section 32b and detector device 36c prior to the deposition of the metalization layer 64. As a result, the metal is deposited directly onto layer 60 in these regions.

Figure 12:
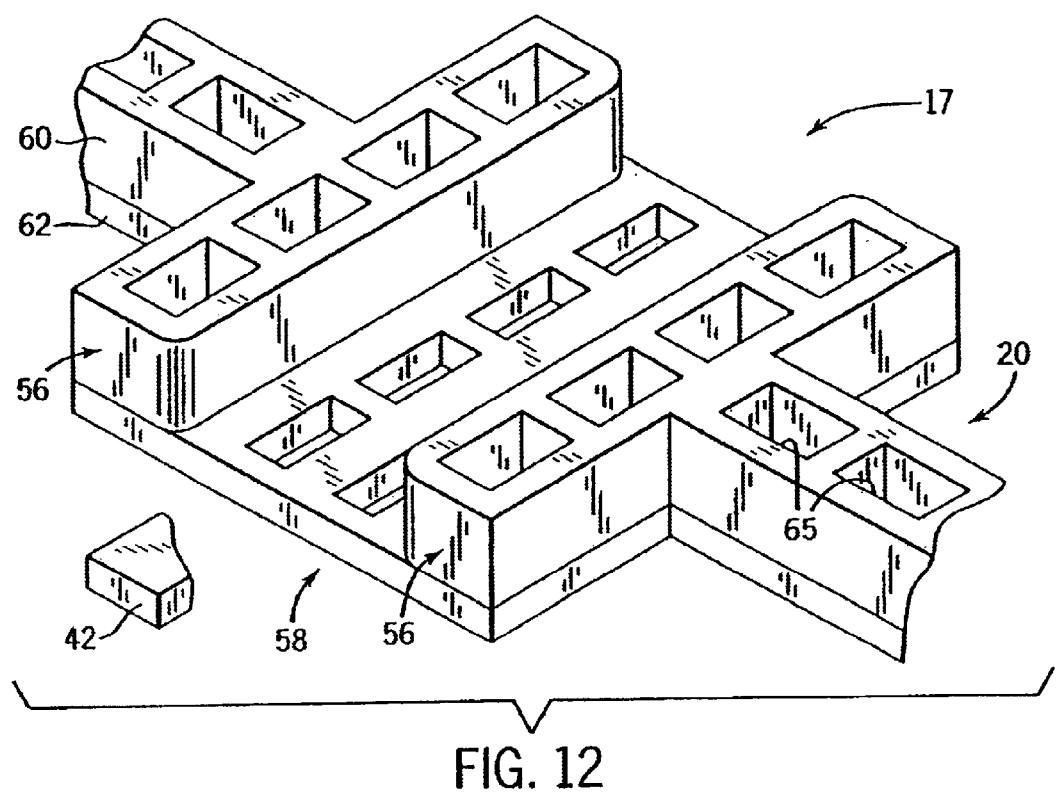
FIG. 12 is a simplified perspective view of an insulating section of the beam of FIG. 6 showing the use of laminated conductive and nonconductive layers and the removal of the conductive layer to create the insulating sections between sensing and biasing portions of the device.

Referring again to FIGS. 6 and 12, in an alternative embodiment, the insulating section 17 between the detector device 36c and the biasing device 36b uses a different technique which incurs direct metal to silicon contact to take advantage of the total height of the silicon structure in creating opposed capacitor plates but at insulating sections 17 the beam 20 expands to create T-bars 56 flanking insulating section 17. Insulating material 58 attached to these T-bars 56 create the insulating section 17. Generally the beam 20 may be fabricated using well-known integrated circuit processing techniques to produce a structure suspended above the substrate 42 and composed of a laminated upper conductive layer 60 (for example, polysilicon or crystalline silicon) optionally with an upper aluminum layer 64 (not shown) and a lower insulating layer 62 such as silicon dioxide or silicon nitride. The insulating section 17 is created simply by etching away the upper layer in the region of the insulating section 17 according to techniques well-known in the art using selective etching techniques.

Each of the upper conductive layers 60 and lower insulating layers 62 are perforated by vertically extending channels 65 such as assists in conducting etchant beneath the layers 60 and 62 to remove a sacrificial layer that normally attaches layers 60 and 62 to the substrate 42 below according to techniques well known in the art.

The technique used to make insulating section 17 may also be used for insulating section 15 in FIGS. 6 and 11.

Figure 5:
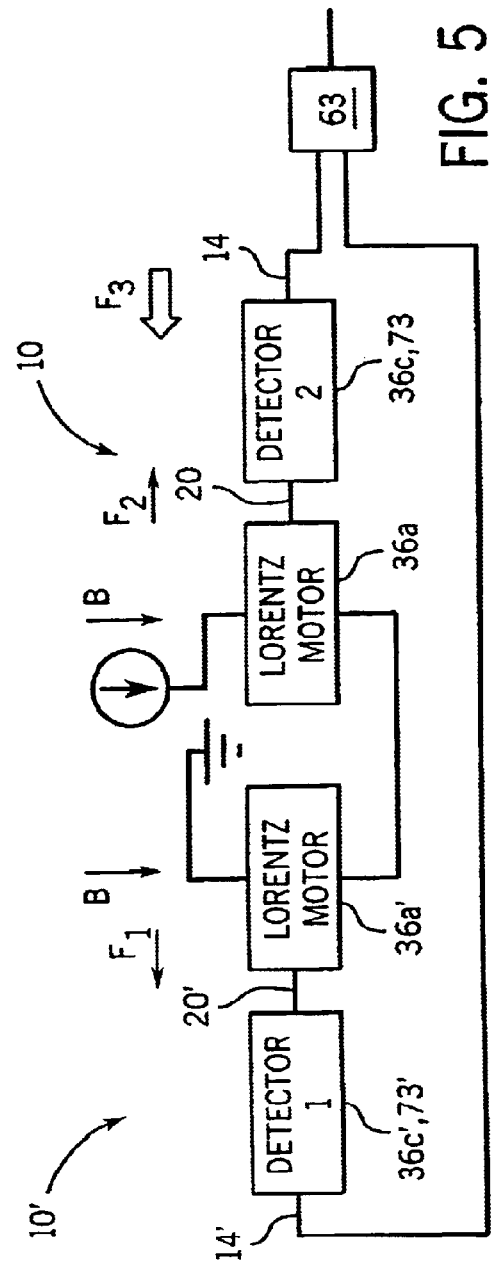
FIG. 5 is a block diagram similar to FIG. 2 showing the use of two separate systems whose outputs are combined by a combiner circuit to distinguish between the Lorentz forces and external mechanical shock or vibration.

Referring now to FIG. 5, the Lorentz motor actuator device 36a and detector device 36c of MEMS magnetic field sensor 10 may be teamed with a MEMS magnetic field sensor 10' having a Lorentz motor actuator device 36a' and detector device 36c' each receiving the same proof current $i_p$, but arranged so that the Lorentz force on the second MEMS magnetic field sensor 10' is in the opposite direction from the Lorentz force on the first MEMS magnetic field sensor 10 for a given crossing magnetic field B. This may be accomplished in a number of ways: as shown by making device 10' a mirror image of device 10 (and reversing the sense of the proof current $i_p$ as shown), or by using the same orientations of beams 20 and 20' and opposite currents and reversed biasing devices. The two detector output signals 14 and 14' are then combined by combiner 63, which serves to double the Lorentz force signal components of the outputs 14 and 14' and to nullify common mode mechanical shock and vibration components. Other variations of this approach described in U.S. application Ser. No. 09/805,410 referred to above.

Figure 8:
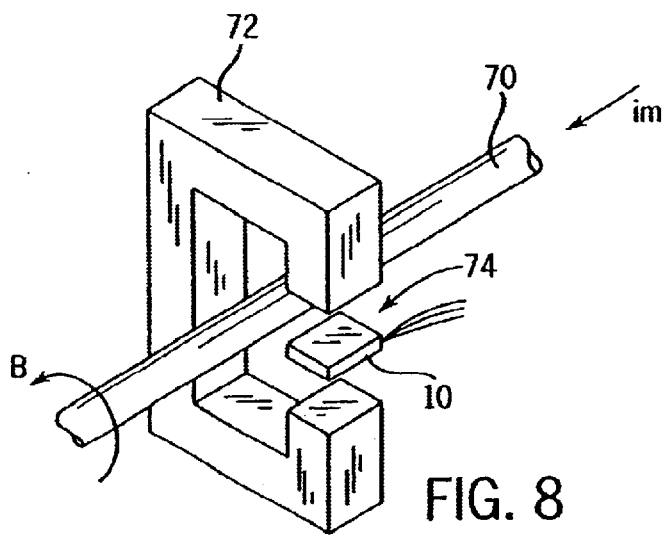
FIG. 8 is a perspective view of a simplified representation of a current sensor implemented with the invention in which magnetic fields induced about a measuring conductor are measured.

Referring now to FIG. 8, the MEMS magnetic field sensor 10 may be placed adjacent to a current measuring conductor 70 conducting a test current i to produce a flux field orbiting the conductor 70 according to the right hand rule. A flux-concentrating core 72 may be placed coaxially around the conductor 70 to channel the flux through a gap 74 in the core 72 in which the MEMS magnetic field sensor 10 is placed. The flux in the gap, which originates from the conductor 70, then becomes the crossing magnetic field B. In this way, the current measuring capabilities of the present invention may be harnessed to provide for current measurement in the conductor 70. From this description, it will be understood that other core and conductor configurations may be used including those in which the conductor 70 is wrapped in coils or the like, possibly around the core 72 and where the compensation coil 21 of FIG. 3 is wrapped around the core 72.

Figure 9:
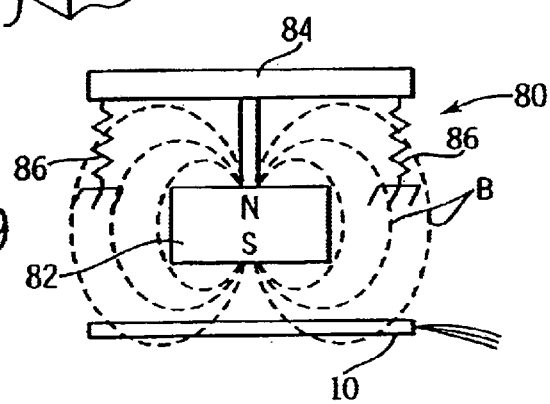
FIG. 9 is a simplified representation of a switch implemented with the invention in which a movable magnetic is detected.

Referring now to FIG. 9, a switch 80 may be constructed in which the MEMS magnetic field sensor 10 is placed in proximity to a permanent magnet 82 mounted to a movable operator 84 biased toward or away from the MEMS magnetic field sensor 10 with springs 86 so that movement of the operator 84 causes movement of the magnet 82 changing the magnetic field imposed on the MEMS magnetic field sensor 10. In this case, the bias device 36b may be given with a constant predetermined bias amount so that a predetermined flux of crossing magnetic field B is required to cause a switching that may be sensed by the detector device 36c or a threshold may be established with a comparator 16 such as shown in FIG. 3 or 4, with or without feedback 18. If feedback 18 is used it may be positive feedback so as to establish hysteresis according to methods understood in the art. Once the switch position changes the positive feedback would cause the beam 20 to remain in position, until some large offsetting field or another electrostatic motor caused it to go back to starting position.

Figure 10A:
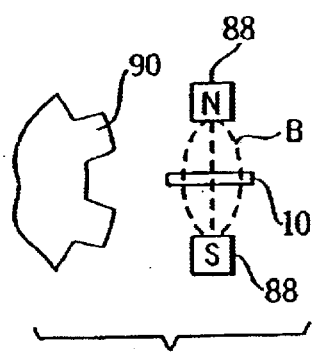
FIGS. 10a and 10b are simplified representations of a proximity detector as implemented using the present invention to detect distortion of a magnetic field by the presence of nearby ferromagnetic material.
Figure 10B:
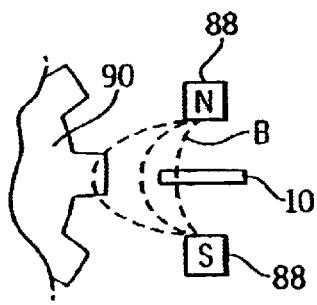

Referring now to FIG. 10, the MEMS magnetic field sensor 10 may be used in conjunction with a magnet structure 88 providing a crossing magnetic field B for the MEMS magnetic field sensor 10. Motions of a nearby ferromagnetic object 90 causing distortion of the crossing magnetic field B may be thus detected by the MEMS magnetic field sensor 10 to produce a proximity switch.

It is specifically intended that the present invention not be limited to the embodiments and illustrations contained herein, but that modified forms of those embodiments including portions of the embodiments and combinations of elements of different embodiments also be included as come within the scope of the following claims. For example, the biasing device may be a thermal, piezoelectric or other electrically controllable MEMS element and the detector device may be other forms of detectors such as optical detectors, resistive detectors, piezoelectric detectors, inductive detectors and the like.

We claim:

1. A microelectromechanical system (MEMS) sensor providing magnetic field measurement, the sensor comprising:
    a substrate supporting a first and second terminal;
    a flexible conductor extending between the first and second terminals and positionable within a crossing magnetic field, the flexible conductor providing a path of conduction of a substantially constant current between the first and second terminals;
    a beam connected to the flexible conductor for communication of displacement of the flexible conductor; and
    a detector connected to the beam for detecting the Lorentz force deflection of the flexible conductor, the detector generating an output signal dependent on this force and thus on the strength of the crossing magnetic field,
    wherein at least a portion of the beam is insulating to electrically isolate the detector from the flexible conductor.

2. The MEMS detector of claim 1 further including a proof current source communicating with the first and second terminals to provide a predetermined proof current through the flexible conductor.

3. The MEMS detector of claim 1 wherein the flexible conductor is substantially straight.

4. The MEMS detector of claim 3 wherein the flexible conductor is less than one millimeter long.

5. The MEMS detector of claim 1 wherein the flexible conductor is a conductive layer on an insulating material and wherein the conductive layer is interrupted on the beam passing to the detector.

6. The MEMS detector of claim 5 wherein the conductive layer is selected from the group consisting of a metal, a semiconductor and a combination of metal and semiconductor.

7. The MEMS detector of claim 1 wherein the substrate further supports integrated circuitry.

8. The MEMS detector of claim 1 wherein the detector is selected from the group consisting at variable gap capacitors, optical detectors, resistive detectors, piezoelectric detectors and inductive detectors.

9. The MEMS detector of claim 1 further including a bias means communicating with the flexible conductor and producing a bias force resisting the Lorentz force of the flexible conductor.

10. The MEMS detector of claim 9 wherein the bias means receives an electrical signal to control the bias source.

11. The MEMS detector of claim 10 wherein the bias source is selected from the group consisting of an electrostatic motor, a thermal motor, and a piezoelectric motor.

12. The MEMS detector of claim 9 wherein the bias source is a flexible element.

13. The MEMS detector of claim 1 further including a bias means communicating with the flexible conductor and producing a bias force augmenting the Lorentz force of the flexible conductor.

14. The MEMS detector of claim 1 further including a feedback circuit communicating with the bias means and responding to the output signal to vary the force resisting the Lorentz force of the flexible conductor.

15. The MEMS detector of claim 1 further including a feedback circuit communicating with the bias means and responding to the output signal to vary the force augmenting the Lorentz force of the flexible conductor.

16. The MEMS detector of claim 1 further including a compensation coil and a feedback circuit responding to the output signal to energize the compensation coil to oppose the crossing magnetic field.

17. The MEMS detector of claim 1 further including magnetic field biasing means and a feedback circuit wherein the feedback circuit modifies the current in the flexible conductor.

18. The MEMS detector of claim 1 further including:
a third and fourth terminal supported by the substrate;
a second flexible conductor extending between the third and fourth terminals and generally parallel with the first flexible conductor and positionable within the crossing magnetic field, the flexible conductor providing a path of conduction of a current between the third and fourth terminals;
a second detector communicating with the second flexible conductor for detecting Lorentz deflection force of the second flexible conductor, the second detector generating a second output signal dependent on this force and thus on the strength of the crossing magnetic field; and
a combiner circuit combining the first and second output signals to reject detector signals not related to the strength of the crossing magnetic field.

19. The MEMS device of claim 18 further including a proof current source communicating with the first, second, third and fourth terminals to provide for opposite currents in the first and second flexible conductors.

20. The MEMS device of claim 18 wherein the first and second output signals are of opposite polarity with Lorentz deflection force of the first and second flexible conductors.

21. The MEMS detector of claim 1 wherein the output signal is an analog signal.

22. The MEMS detector of claim 1 wherein the output signal is a digital signal.

23. The MEMS detector of claim 1 further including a measurement conductor for conducting a current to be measured therethrough, the measurement conductor position adjacent to the flexible conductor whereby the crossing magnetic field is a magnetic field produced by the current to be measured;
whereby the output signal provides an indication of the current to be measured.

24. The MEMS detector of claim 23 further including a magnetic core concentrating the flux from the measurement conductor to impinge on the flexible conductor.

25. The MEMS detector of claim 24 further including a compensation coil and a feedback circuit responding to the output signal to energize the compensation coil to oppose the crossing magnetic field wherein the compensation coil couples to the magnetic core.

26. The MEMS detector of claim 1 further including a magnet providing a predetermined crossing magnetic field.

27. The MEMS detector of claim 1 further including a switch operator movable to vary the crossing magnetic field;
whereby the output signal may provide a switch signal indicating movement of the switch operator.

28. The MEMS detector of claim 27 wherein the operator is attached to a permanent magnet.

29. A method of sensing a magnetic field using a microelectromechanical system (MEMS) comprising the steps of:
positioning a flexible MEMS conductor between a first and second terminal within a crossing magnetic field;
applying a proof current to the flexible MEMS conductor to generate a Lorentz force on the flexible conductor;
employing a beam connecting the flexible conductor to a detector for communication of displacement of the flexible conductor to the detector, wherein the beam includes an insulating portion; and
detecting Lorentz force induced deflection of the flexible MEMS conductor to generate an output signal dependent on the Lorentz force and thus on the strength of the crossing magnetic field.

30. The method of claim 29 wherein the proof current is constant.

31. The method of claim 29 wherein the flexible conductor is substantially straight.

32. The method of claim 29 wherein the step of detecting a Lorentz deflection of the flexible conductor employs a detector is selected from the group consisting of variable gap capacitors, optical detectors resistive detectors, inductive detectors and piezoelectric detectors.

33. The method of claim 29 further including the step of imposing a bias force on the flexible conductor resisting the Lorentz force.

34. The method of claim 29 further including the step of imposing a bias force on the flexible conductor augmenting the Lorentz force.

35. The method of claim 34 wherein the bias force is proportional to the Lorentz force.

36. The method of claim 34 wherein the bias force is proportional to deflection of the flexible conductor.

37. The method of claim 29 further including a compensation coil and including the step of energizing the compensation coil to neutralize the crossing magnetic field at the flexible conductor.

38. The method of claim 29 further including the steps of
positioning a second flexible MEMS conductor between a third and fourth terminal within the crossing magnetic field;
applying a proof current to the second flexible MEMS conductor;
detecting a Lorentz force induced deflection of the second flexible MEMS conductor to generate a second output signal dependent on the Lorentz force and thus on the strength of the crossing magnetic field; and
combining the first and second output signals to reject detector signals not related to the strength of the crossing magnetic field.

39. The method of claim 38 wherein the step of applying the proof current to the first and second flexible MEMS conductors applies the proof currents in opposite directions.

40. The method of claim 38 wherein the first and second output signals are of opposite polarity with Lorentz deflection force of the first and second flexible MEMS conductors.

41. The method of claim 38 further including the step of concentrating the flux from the measurement conductor to impinge on the flexible conductor through a magnetic core.

42. The method of claim 41 further including the step of coupling a compensation coil to the magnetic core and using a feedback circuit responding to the output signal to energize the compensation coil.

43. The method of claim 29 wherein the output signal is an analog signal.

44. The method of claim 29 wherein the output signal is a digital signal.

45. The method of claim 29 further including the step of positioning a measurement conductor for conducting a current to be measured therethrough adjacent to the flexible conductor whereby the crossing magnetic field is a magnetic field produced by the current to be measured;

whereby the output signal provides an indication of the current to be measured.

46. A microelectromechanical system (MEMS) sensor providing magnetic field measurement, the sensor comprising:

a substrate supporting a set of pylons;

a beam supported above the substrate by at least two pairs of opposing flexible arms extending transversely to the pylons on opposites sides of the beam;

a flexible conductor supported by one pair of opposing flexible arms extending between first and second terminals on corresponding opposed pylons, the flexible conductor positionable within a crossing magnetic field to provide a path of conduction of a current between the first and second terminals;

an actuator device communicating with the flexible conductor via the beam to provides a biasing force against a Lorentz force acting on the flexible conductor, and a detector communicating with the actuator for detecting the biasing force.

47. The microelectromechanical (MEMS) sensor of claim 46, wherein at least a portion of the beam is insulating.

48. The microelectromechanical (MEMS) sensor of claim 46, wherein the detector is electrically isolated from the flexible conductor.

49. The microelectromechanical (MEMS) sensor of claim 46, wherein the actuator is electrically isolated from the detector.

50. The microelectromechanical (MEMS) sensor of claim 46, wherein the Lorentz force is dependent upon the strength of the crossing magnetic field.

* * * * *